United States Patent

Brown et al.

[11] 4,007,428
[45] Feb. 8, 1977

[54] AUTOMATIC GAIN CONTROL OF PULSES

[75] Inventors: Alvin E. Brown, Claremont, Calif.;
Willy J. Fick, Sonderborg, Denmark

[73] Assignee: Danfoss A/S, Nordborg, Denmark

[22] Filed: Aug. 7, 1975

[21] Appl. No.: 602,884

[52] U.S. Cl. .............................. 330/129; 330/139
[51] Int. Cl.[2] ......................................... H03G 3/20
[58] Field of Search ............. 330/29, 86, 127, 129, 330/138, 139; 328/173, 175; 325/410

[56] References Cited
UNITED STATES PATENTS

| | | | |
|---|---|---|---|
| 2,810,825 | 10/1957 | Keizer et al. | 325/410 |
| 3,331,030 | 7/1967 | Jordan et al. | 330/139 X |
| 3,611,383 | 10/1971 | Bar | 325/410 X |

Primary Examiner—James B. Mullins

[57] ABSTRACT

The amplification of periodic or aperiodic pulses is varied by envelope detecting the received pulses and passing the resulting envelope waveform to a latching comparator which, when enabled, provides an output pulse whenever the input waveform has an amplitude which exceeds a predetermined value. An itegrator coupled to the output of the comparator is continuously operative to increase or decrease the gain of the amplifier according to the absence or presence respectively of the output comparator pulse. In this manner the amplitude of signals or pulses is automatically controlled despite circuit and transmission vagaries.

5 Claims, 2 Drawing Figures

AUTOMATIC GAIN CONTROL OF PULSES

BACKGROUND OF THE INVENTION

This invention relates to an automatic gain control and, more particularly, to an automatic gain control circuit capable of functioning with aperiodic input signals.

There are many applications such as radar, sonar and ultrasonic flow measurement, to name a few, which transmit bursts of energy, electromagnetic, ultrasonic or otherwise, at both periodic and aperiodic rates. In these applications either the transmission line of the burst of energy across a known distance is measured or the time for the burst of energy to be propagated outwardly, strike an object, and be reflected back therefrom, is measured. Regardless of the application or environment, in each case, the transmitted energy is received by an appropriate antenna, transducer, or the like, and thereby converted into electrical signals for processing. As part of the processing, these electrical signals desirably should have a constant amplitude. Otherwise, particularly where precise measurements are required, phase and other distortions can occur in the processing and measuring circuitry which create undesired errors in the measurements.

Automatic gain control is used to maintain a constant amplitude of the received signals. Among many of the known automatic gain control circuits, there is a continuously transmitted signal often having a carrier wave whose amplitude may be monitored and used to automatically control the gain of an amplifier and thereby maintain a constant received signal amplitude for the processing. In instances where the signals are aperiodic or where there is a large amount of noise present in the received signals, particularly where the said received signals are in the form of aperiodic bursts of energy, it is relatively difficult to obtain a stable reference point which may be used to monitor the received signal amplitude and thereby control and maintain constant the received signal amplitude.

Accordingly, it is an object of this invention, to obviate any of the disadvantages of the pulse type automatic gain control circuits.

A further object of this invention is to provide an improved automatic gain control circuit having particular application with aperiodic input pulses.

SUMMARY OF THE INVENTION

Automatic gain control is provided for maintaining the received burst signal amplitude of transmitted bursts of energy constant. This automatic gain control includes an amplifier for amplifying the received signal, means for varying the gain of the amplifier in accordance with a gain control signal, latching means for providing an output signal when the received signal exceeds a predetermined amplitude, and an integrator coupled to the latching means for generating said gain control signal to decrease the gain of the amplifier in the presence of the output signal and to decrease the gain of the amplifier in the absence of said output signal.

In a particularly preferred embodiment, the latching means receives an inhibit input signal which is related to the burst time of transmission. This prevents the input signal from affecting the latching means at least during the time the burst is being transmitted. In this manner, the integrator automatically decreases the gain of the amplifier if indicated by any received pulse and is permitted to increase the gain in the amplifier at all other times. With this technique of controlling the amplification, using an integrator which is continually integrating up or down, the system constantly seeks a level at which the envelope waveform will vary on either side of the predetermined amplitude, thereby maintaining a constant amplitude received pulse. This seeking occurs in disregard of spurious noise and other unwanted signals or aperiodic signals.

DETAILED DESCRIPTION OF THE PREFERRED EMBODIMENTS

Figure 1:
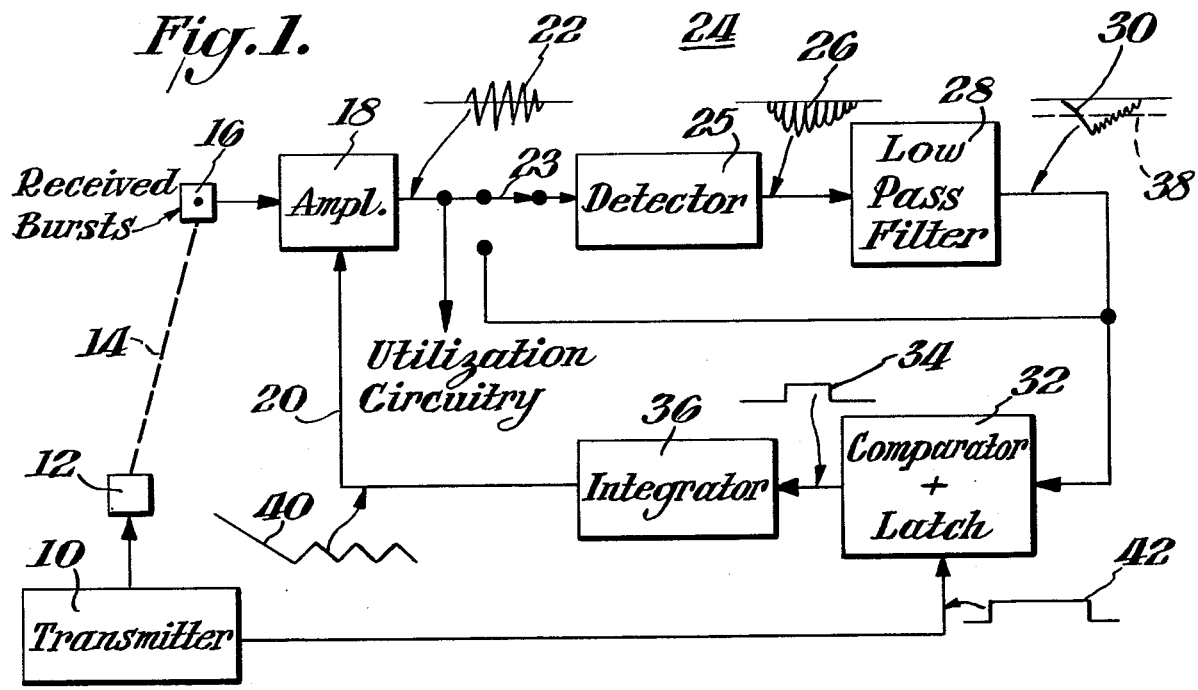
FIG. 1 is a block diagram depicting a system constructed in accordance with this invention for automatic gain control.

There may be seen in FIG. 1 a typical system in which either periodic or aperiodic bursts of energy are transmitted. These bursts of energy are transmitted by a transmitter 10 which may be either capable of transmitting electromagnetic energy such as a radar transmitter or ultrasonic energy such as is used in sonar type devices and in ultrasonic flow measurement. In either event the transmitter passes an electrical signal to a transducer or antenna 12 such that the signal is converted to either electromagnetic energy or ultrasonic energy and transmitted over a path depicted by the dotted line 14. This energy may be directly transmitted across space to a receiving transducer 16 or it may be reflected from some device (not shown) and then received by the receiving transducer 16.

In any event these received bursts of energy are converted to electrical energy by the receiving antenna or transducer, and passed to a variable gain amplifier 18 of conventional design for amplification. This amplifier is of a known type capable of providing a gain which is varied in accordance with a control signal fed to the line 20. The amplified bursts depicted by the waveform 22 are passed from the amplifier 18 through a two position switch 23 either to an envelope detector 24 or directly to a comparator and latch 32, and, in addition, may be passed on to appropriate utilization circuitry such as the measurement circuitry of an ultrasonic flowmeter. The envelope detector 24 full wave rectifies the burst or pulse signal 22 so as to provide a series of what is, in this instance, depicted as negative-going pulses 26. The detector 24 also includes a low pass filter 28 which removes the high frequency components from the waveform 26 so as to provide the envelope waveform 30.

This negative-going envelope waveform 30 is applied to a comparator and latch circuit 32 which, when not inhibited by an inhibit pulse from the transmitter 10, is capable of providing an output pulse 32 which is applied to an integrator 36. The latch portion of the circuitry may be simple logic circuitry which provides an output pulse when the amplitude of the waveform 38 exceeds a predetermined level as will be described. The operation of the integrator is such, that in the presence of the pulse 34, the integrator will integrate up, in a positive going sense, to provide a control signal to the amplifier 18 which reduces the gain of the amplifier. Conversely in the absence of the pulse 34, the integrator integrates down in a negative-going sense which increases the gain of the amplifier 18.

The operation of the comparator and latch circuit 32 is such that the pulse 34 in initiated when the envelope waveform 30 exceeds a predetermined negative-going amplitude denoted by the dashed line 38. This impulse 34 will remain until the inhibit pulse 42 from the transmitter 10 terminates it. This may be accomplished by conventional logic circuitry or more preferably using the circuitry depicted in FIG. 2 as will be described.

In this manner the automatic gain control circuit is continually seeking, even in the presence of the aperiodic pulses, some voltage control level 40 which will cause the amplifier 18 to provide constant amplitude output pulses. This seeking by the integrator occurs in one sense to increase the gain of the amplifier at all times. This continues even as pulses are being received until a pulse is received having an envelope whose amplitude exceeds some predetermined level 38. At this point the integrator, actuated by the logic pulse 34, integrates in the opposite sense so as to reduce the gain of the amplifier. This alternate up-down integration continues so as to achieve control on an averaged basis over a long period of time to provide the constant received signal amplitude.

The comparator is disabled by an inhibit or guard input signal 42 and thereby prevented from responding except during times other than those at which the inhibit pulse is transmitted. This prevents overloading the comparator during the active transmission period. The inhibit input controls the time duration of the pulse 34.

If the switch 23 is switched to bypass the detector 24 the response of the AGC circuit is to the peak values of the pulse waveform 22 rather than average values as occurs when the detector 24 is in the circuit.

Figure 2:
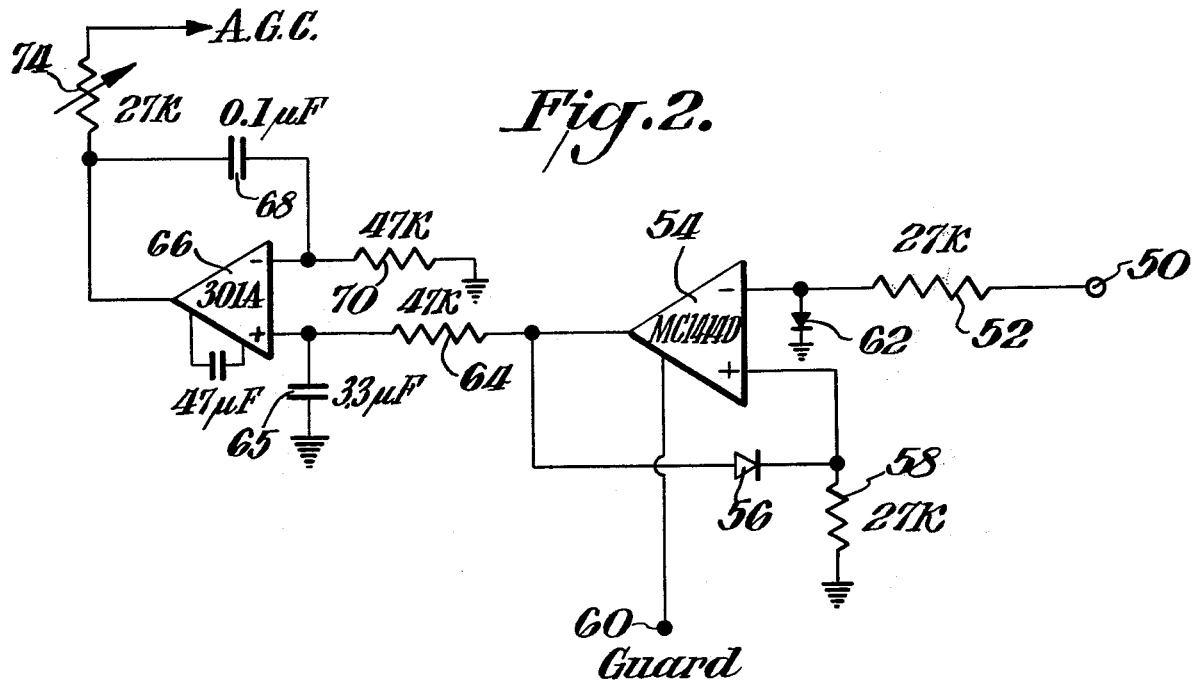
FIG. 2 is a schematic diagram of circuitry capable of performing the comparator and latch, and integrator functions depicted in FIG. 1.

In a particularly preferred embodiment, the comparator and latch circuit may be implemented using integrated circuits as depicted in FIG. 2. In FIG. 2 the input from the low pass filter, i.e., the envelope waveform 30, is applied to the input terminal 50. This preferably is a current input which is applied through a resistor 52 to the inverting input of a comparator 54. This comparator may be any suitable integrated circuit such as the MC 1414L or SN 72514N operating in a self-latching mode. To achieve this, the output is coupled back through a forward conducting diode 56 to the non-inverting input and also through a resistor 58 to ground. An inhibit or guard input from the terminal 60 (from transmitter 10) is coupled to the comparator 54. In like manner the inverting input is coupled through a forward conducting diode 62 to ground.

The output of the comparator 54 is coupled through a series connected integrating resistor 64 and integrating capacitor 65 to the non-inverting input of an operational amplifier 66, such as the 301A. The output of the operational amplifier 66 is coupled through the capacitor 68 to the inverting input and thence through a resistor 70 to ground for the purpose of stabilizing against oscillations. The output is also connected through a resistor 74 to provide the automatic gain control signal which is coupled to the amplifier 18 (FIG. 1).

In operation, the integrating resistor 64 constitutes a load for the preceding circuit such that the comparator has a current input and therefore the amplifier 66 may perform the integration function. This comparator, operated in a self-latching mode, receives guard or inhibit signals at the terminal 60 which force the output of the comparator to a logic low level regardless of input. With the output low, no voltage is fed to the non-inverting input load resistor 58.

However when the incoming signal (waveform 30 or 22) increases negatively in amplitude above a predetermined level depicted by the line 38 (FIG. 1), the comparator changes state with a logic level high at the output which is coupled to the non-inverting input. This holds the comparator in a logic high state as long as the inverting input level remains lower than the non-inverting input level and as long as the guard signal remains in a logic high state. To insure that this condition prevails and that spurious opposite polarity swings, in this case positive swings, of the incoming signal will not reset the circuit, the diode 62 is connected to ground. In this manner the highest positive voltage swings at the inverting input will be that of the forward diode potential, in a typical case 0.7 volts.

The comparator remains in the latched state providing an output pulse signal, or high logic level 34 (FIG. 1), until reset by the next logic low state of the guard or inhibit input signals 42 from the transmitter. Any attempts to trip the latch by negative-going input signals have no effect during this guard-low period. When the latch is tripped because the gain of the AGC amplifier 18 (FIG. 1) is too high, positive pulse 34 results. The integrator 66 is forced to integrate in an up or positive-going sense or direction which decreases the gain of the amplifier 18.

On the other hand if the input to the comparator was not of sufficient magnitude to trip the latch, the logic low level, about −0.4 volts in the circuitry illustrated, will prevail. The integrator 66 integrates down or in a negative-going sense, thereby increasing the gain of the amplifier 18. If other forms of latches without a negative voltage are used, a positive voltage is applied to resistor 70 rather than ground.

This continuous process of adjusting the gain of the amplifier maintains a constant amplitude signal 22 at the output of the amplifier regardless of vagaries of the signal transmission paths, the signal transmission circuitry, the transmitter or the receiver circuitry up to and including the amplifier. The gain is continuously adjusted between pulses to maintain a relatively constant signal amplitude. The guard pulse from the transmitter prevents the circuit from responding except at the desired time intervals when the received pulse is occurring or expected to occur. Also, the inhibit pulse determines the maximum time duration of the pulse 34. By adjustment of this time period, the operation of the AGC may be also adjusted. The circuit has particular application to aperiodic pulses.

We claim:
1. An automatic gain control for maintaining the received burst signal amplitude derived from transmitted bursts of energy constant comprising, in combination,
   an amplifier for amplifying the received signal,
   means for varying the gain of said amplifier in accordance with a gain control signal,
   latching means for providing a constant amplitude output pulse when said received signal exceeds a predetermined amplitude, and
   an integrator coupled to said latching means responsive to said output pulse for generating said gain control signal to decrease the gain of said amplifier at a predetermined rate in the presence of said output pulse and to increase the gain of said ampli- fier at a predetermined rate in the absence of said output pulse.

2. An automatic gain control as claimed in claim 1 wherein said latching means is adapted to receive an inhibit input signal which terminates said output pulse whereby said integrator increases the gain of said amplifier during said transmitted bursts.

3. An automatic gain control according to claim 2 wherein said latching means is a comparator having an inverting input coupled to receive said received signal and a non-inverting input coupled to the comparator output, whereby said comparator will remain latched to provide said output pulse so long as the absolute value of the signal at said inverting input is greater than the absolute value of the signal at said non-inverting input.

4. An automatic gain control according to claim 3 wherein a unidirectional conducting device connects said inverting input to a point of reference potential in a forward conducting sense to prevent unlatching said comparator.

5. An automatic gain control according to claim 2 wherein said transmitted bursts are aperiodic.

* * * * *